United States Patent [19]

Proud, Jr.

[11] 4,104,557
[45] Aug. 1, 1978

[54] LIQUID DIELECTRIC RADIO FREQUENCY PULSE GENERATORS

[75] Inventor: Joseph M. Proud, Jr., Wellesley Hills, Mass.

[73] Assignee: GTE Laboratories Incorporated, Waltham, Mass.

[21] Appl. No.: 741,927

[22] Filed: Nov. 15, 1976

[51] Int. Cl.² ........................ H01J 7/46; H01J 19/80
[52] U.S. Cl. .................................. 315/39; 307/106; 333/13; 333/82 B; 331/127
[58] Field of Search ............... 315/39; 307/106, 107; 333/13, 82 B; 331/127

[56] References Cited

U.S. PATENT DOCUMENTS

| 3,484,619 | 12/1969 | Proud, Jr. | 315/39 |
| 3,748,528 | 7/1973 | Cronson | 315/39 |

Primary Examiner—Saxfield Chatmon, Jr.
Attorney, Agent, or Firm—Fred Fisher

[57] ABSTRACT

A liquid dielectric radio frequency pulse generator capable of providing high energy pulses having an in-line construction includes an annularly shaped spark gap immersed in an aprotic liquid such as molten sulfur, sulfur monochloride or mixtures thereof. The input voltage is connected to the resonant element through a central aperture provided in the spark gap rings for high efficiency operation.

12 Claims, 1 Drawing Figure

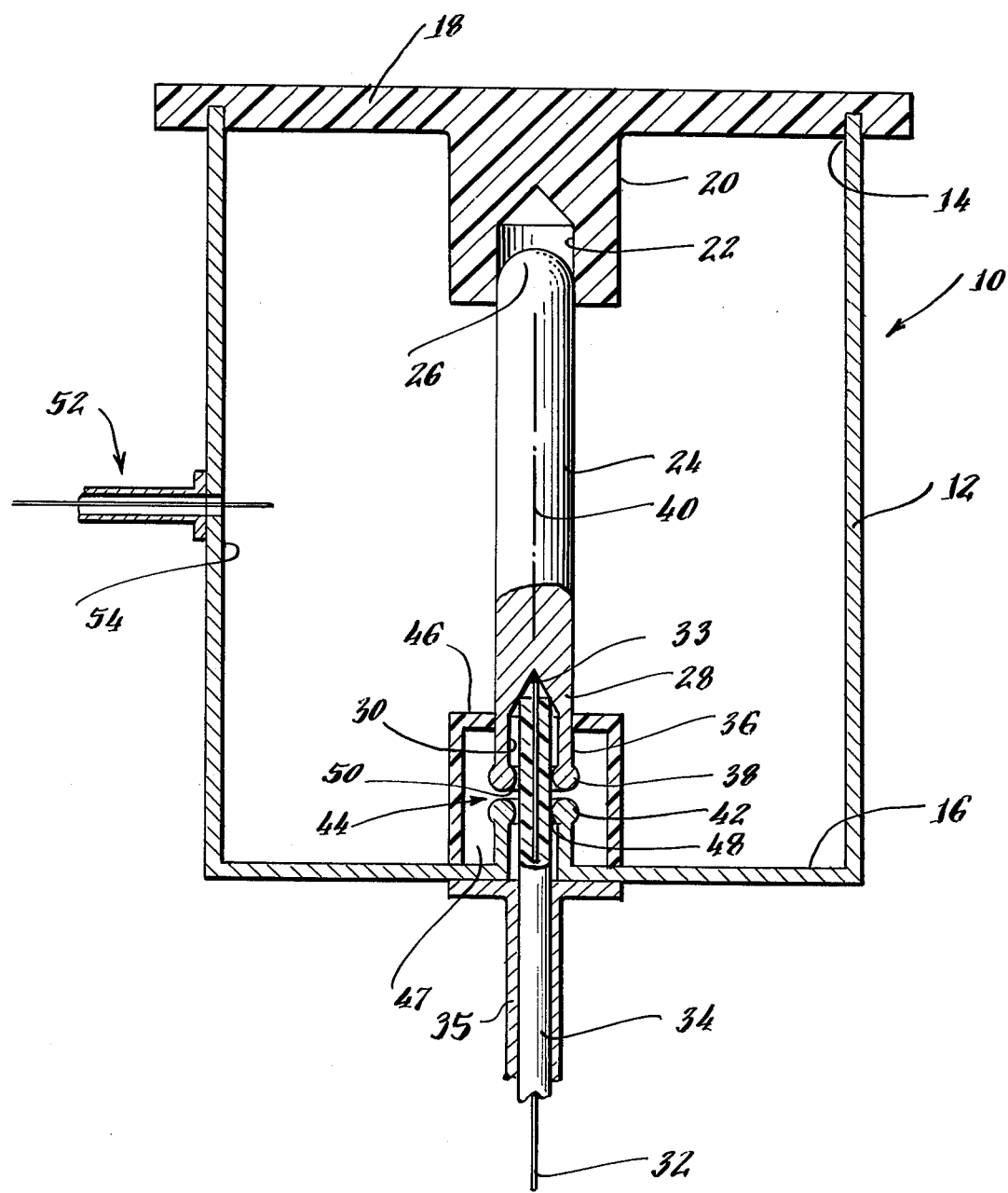

LIQUID DIELECTRIC RADIO FREQUENCY PULSE GENERATORS

BACKGROUND OF THE INVENTION

This invention relates to radio frequency pulse generating devices and, in particular, to high energy microwave pulse generators having a spark gap immersed in liquid.

It is known to produce bursts of microwave energy by switching power across a gap or gaps in the central conductor of a coaxial line or waveguide, as shown in U.S. Pat. No. 3,521,121 issued July 21, 1970 to J. M. Proud, JR., U.S. Pat. No. 3,484,619 issued Dec. 16, 1969 to J. M. Proud, Jr., U.S. Pat. No. 3,748,528 issued July 24, 1973 to H. Cronson and copending U.S. Patent application Ser. No. 661,677 entitled, "High Voltage Control Devices" to J. M. Proud, Jr., filed Feb. 26, 1976. These devices are capable of providing high energy pulse bursts of microwave power up to approximately 10 GHz. In the waveguide device disclosed in the patent to H. Cronson, the center conductor of the coaxial line is provided with one or more switching gaps along its length and/or the end post spaced from the interior wall of the waveguide. A radio frequency (RF) block or impedance is disposed around the post adjacent the first switching gap with the gaps so dimensioned that energy switched by the first gap can pass the block or impedance, but oscillations caused by the discharge at the second gap cannot pass the block. The spark gap functions to steepen the leading edge of the traveling wave. The prior art structures possess several shortcomings which the instant invention overcomes. These shortcomings include, but are not limited to, poor efficiency, since the capacitance of the RF block, to be effective, must be relatively large compared to the distributed capacity of the end post. The capacitance of the RF block stores most of the initial energy and, upon discharge, tends to react with the lumped value of inductance in the post, resulting in low frequency oscillations which typically are less than one-half the desired operating frequency. In the Cronson waveguide device, mentioned hereinbefore, such oscillations lie below the waveguide cut-off frequency and would not be observed. However, the existence of such oscillations have been observed by the applicant using coaxial resonators operating in the lowest TEM mode with no cut-off frequency. This problem cannot be overcome by reducing the capacitance of the RF block since this would permit the microwave oscillations to leak out of the resonant structure.

Furthermore, the Cronson device requires a spark gap of relatively small dimensions to provide rapid charging of the end post. This causes the small electrode surface of the gap to wear rapidly under sparking causing rapid deterioration of the fast switching properties of the closely spaced spark gap. A sliding short is also used to adjust the coupling between the waveguide and the end post. However, it does not enable tuning of the generator since the microwave frequency generated is determined primarily by the cross sectional dimensions of the waveguide.

It is also known, by those knowledgeable in the art, to use liquid or gaseous sparking mediums since their insulation and self-repairing properties may be superior to air. However, prior known liquids were found to decompose under repetitive sparking (arcing) conditions, thereby lowering the dielectric breakdown strength of the liquid. Insulating gases, to offer practical operating ranges, require pressurization in the spark area.

Therefore, it is an object of the present invention to overcome the shortcomings of presently known radio frequency generators.

It is a further object of the present invention to provide a highly efficient, high power radio frequency generator with a liquid insulating medium.

Another object of the present invention is to provide a liquid insulating medium which may be utilized in numerous spark gaps.

Still another object of the present invention is to provide a liquid sparking medium which does not substantially decompose under repetitive sparking conditions.

Yet another object of the present invention is to provide a sparking medium which also serves to remove heat from the sparking region.

A still further object of the present invention is to provide a novel microwave frequency generator which is small in size and relatively inexpensive to manufacture as compared to conventional RF microwave generators of equal output power.

The foregoing and other objects and advantages will appear from the description to follow. In the description, reference is made to the accompanying drawing which forms a part thereof, and in which is shown by way of illustration, a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

SUMMARY OF THE INVENTION

A radio frequency generator for providing high energy pulses, according to the principles of the instant invention, comprises, in combination, an elongated resonant cavity having an open end and an essentially closed end; insulator means adapted to cooperate with the cavity open end and having an inwardly extending portion, the inwardly extending portion being provided with support means; and a elongated resonant element centrally disposed within the resonant cavity, one end thereof being disposed within the insulator support means, the resonant element being provided with input receiving means at its other end proximate the longitudinal axis thereof; switching means disposed on the other end of the resonant element and connected to the closed end of the resonant cavity; housing means for enclosing the switching means; liquid disposed within the housing, means and input terminal means adapted to be coupled to a source of pulsed voltage and including an electrically conductive means for providing a conductive path to the resonant element input receiving means.

BRIEF DESCRIPTION OF THE DRAWING

In order that the invention may be more fully understood, it will now be described by way of example, with reference to the sole illustration which is a pictorial representation, in cross section of the preferred embodiment of the present invention.

DESCRIPTION OF THE PREFERRED EMBODIMENT

The preferred embodiment of the liquid dielectric radio frequency generator 10 of the present invention is shown in the sole illustration. An elongated resonant cavity 12 of the coaxial type (coaxial resonator) is provided with an open end 14 and an essentially closed end 16. An insulator element 18 is of generally circular shape and fabricated to be inserted into and seal the open end 14 of the conductive coaxial resonator 12, thereby confining all of the microwave energy within the coaxial resonator.

The insulator element 18 is provided with an inwardly extending portion 20 having a circular aperture 22 centrally disposed therein which functions as a receptacle and support for the anti-node end 26 of an elongated cylindrically-shaped resonant element 24 which preferably is one-quarter wavelength long.

The other end 28 of the resonant element 24 is provided with an aperture 30 which functions as the input voltage receiving terminal and is in electrically conductive contact with the input terminal means 32 at point 33 via an electrically conductive wire path which forms the inner conductor of a coaxial input line. The coaxial input line includes an outer conductor 35 and a dielectric 34.

The edge portion 36 of the end 28 of the resonator element 24 is provided with a first annular ring 38 transverse to the longitudinal axis 40 of the resonant element 24. A second annular ring 42 is displaced from and in juxtaposition with the first annular ring 38 and coaxially aligned therewith and connected to the closed end 16 of the coaxial resonator 12, thereby forming a spark gap 44.

An electrically non-conducting housing support member 46 maintains the end 28 of the resonant element 24 in a fixed position, thereby fixing the spark gap 44 at a predetermined distance.

The housing 46 is sealed in a conventional manner and is provided with means, not shown, for introducing the aprotic molecular liquids, molten sulfur, sulfur monochloride ($S_2Cl_2$) and polyflourinated ether 47 which are capable of being subjected to repetitive sparking without serious decomposition or degradation, thus maintaining a substantially constant dielectric.

The principal advantage of utilizing liquid dielectric media over gaseous dielectric media is the fact that liquids do not require pressurization to achieve a high value of dielectric constant. For electrical stresses applied for relatively short times, such as microseconds, a typical liquid dielectric strength is approximately $10^6$ volts/cm, whereas a typical gas at atmospheric pressure will exhibit a strength of $2 \times 10^4$ volts/cm. To achieve a dielectric strength of comparable value, a gas must be pressurized to a value of approximately 50 atmospheres or about 700 pounds per square inch. Thus, where small size is critical, the high dielectric strength of a liquid may be utilized to advantage permitting close spacing of the sparking electrodes without requiring reinforcement to support an elevated gas pressure.

The use of a liquid dielectric offers the additional advantage of having a greater density than a gas, thus providing a means of removing heat generated by the sparking by means of convection and condition without requiring means for moving the liquid.

The preferred liquids described hereinbefore also have the capability of rapidly recovering from sparking without decomposing or expanding with the added heat encountered, thus making containment thereof an easy matter.

It is to be noted that the conductive path from the input terminal means 32 passes through apertures 48 and 50 provided in rings 42 and 38, respectively, thus permitting internal connection to the resonant element 24 at point 33. The point of contact 33 from input terminal 32 is made at virtually zero microwave field so that little or no conducted microwave loss can occur via the input terminal means 32 and conductive path. Since the contact point 33 is at virtually zero microwave field, the requirement for a RF block used in the prior art resonant structures is obviated. Input terminal 32 is adapted to be coupled to a source of high voltage pulsed DC, not shown.

A conventional output probe 52 may be unobstructively provided in the cavity wall 54 at a convenient position between the open 14 and closed 16 ends of the cavity 12. Pick-up loops and capacity-type signal couplers may also be used.

In operation, the rapid breakdown of spark gap switch 44 generates microwave oscillations within the resonant cavity 12 which are confined to the space between the resonant element 24 and the walls 54 of the cavity 12. Output energy is obtained via probe 52.

The use of annular rings for electrodes to form the spark gap in conjunction with a liquid dielectric clearly reduces the wear occasioned by the use of a conventional spark gap which utilizes centrally located electrodes. The wear characteristics of the annular ring electrodes has been found to be one order of magnitude better, which more than offsets the initial increased difficulty in maintaining parallelism and accurate spark gap spacing over the annular region. The nature of wear with the annular ring electrodes tends to be in the direction to maintain parallelism.

It will be understood that various changes in the details, materials, arrangements of parts and operating conditions which have been herein described and illustrated in order to explain the nature of the invention may be made by those skilled in the art within the principles and scope of the invention.

Having thus set forth the nature of the invention what is claimed is:

1. A liquid dielectric radio frequency generator for providing high energy pulses comprising in combination:
   a. an elongated resonant cavity having an open end and an essentially closed end;
   b. insulator means adapted to cooperate with said cavity open end and having an inwardly extending portion, said inwardly extending portion being provided with support means;
   c. an elongated resonant element centrally disposed within said resonant cavity, one end thereof being disposed within said insulator support means, said resonant element being provided with input receiving means at its other end proximate the longitudinal axis thereof;
   d. switching means disposed on said other end of said resonant element and connected to said closed end of said resonant cavity;
   e. housing means for enclosing said switching means;
   f. a liquid disposed within said housing means; and
   g. input terminal means adapted to be coupled to a source of pulsed voltage and including an electrically conductive means for providing a conductive path to said resonant element input receiving means.

2. A liquid dielectric radio frequency generator according to claim 1 wherein said switch means comprises a spark gap formed with a pair of annular rings with a gap therebetween, one of said rings being disposed on an edge portion of said other end transverse to said longitudinal axis, the other of said rings being juxtaposed and coaxially aligned with said one ring and connected to said closed end of said resonant cavity.

3. A liquid dielectric radio frequency generator according to claim 1 further including an output probe disposed through a wall of said resonant cavity between said open end and said closed end thereof.

4. A liquid dielectric radio frequency generator according to claim 1 wherein the length of said resonant element is one-quarter wavelength.

5. A liquid dielectric radio frequency generator according to claim 1 wherein the resonant cavity is of the coaxial type.

6. A liquid dielectric radio frequency generator according to claim 1 wherein said resonant element receiving means includes an aperture for receiving said electrically conductive means.

7. A liquid dielectric radio frequency generator according to claim 2 wherein said annular spark gap rings are provided with centrally disposed apertures to define said conductive path between said resonant element input receiving means and said input terminal means.

8. A liquid dielectric radio frequency generator according to claim 1 wherein said liquid is an aprotic liquid.

9. A liquid dielectric radio frequency generator according to claim 8 wherein said aprotic liquid is molten sulfur.

10. A liquid dielectric radio frequency generator according to claim 8 wherein said aprotic liquid is $S_2Cl_2$.

11. A liquid dielectric radio frequency generator according to claim 8 wherein said aprotic liquid is a mixture of molten sulfur and sulfur monochloride.

12. A liquid dielectric radio frequency generator according to claim 1 wherein said liquid is polyfluorinated ether.

* * * * *